United States Patent [19]

Frahm et al.

[11] Patent Number: 4,707,658
[45] Date of Patent: Nov. 17, 1987

[54] METHOD OF RAPID ACQUISITION OF SPIN RESONANCE DATA FOR A SPATIALLY RESOLVED INVESTIGATION OF AN OBJECT

[75] Inventors: Jens Frahm; Axel Haase; Dieter Matthaei; Wolfgang Haenicke; Klaus-Dietmar Merboldt, all of Goettingen, Fed. Rep. of Germany

[73] Assignee: Max-Planck-Gesellschaft zur Foerderung der Wissenschaften e.V., Goettingen, Fed. Rep. of Germany

[21] Appl. No.: 828,956

[22] Filed: Feb. 12, 1986

[30] Foreign Application Priority Data

Feb. 12, 1985 [DE] Fed. Rep. of Germany ....... 3504734

[51] Int. Cl.$^4$ .......................................... G01R 33/20
[52] U.S. Cl. .................................. 324/309; 128/653; 324/316
[58] Field of Search ............... 324/309, 310, 311, 312, 324/313, 314, 316; 128/653

[56] References Cited

U.S. PATENT DOCUMENTS

| | | | |
|---|---|---|---|
| 4,115,730 | 6/1978 | Mansfield | 324/309 |
| 4,165,479 | 8/1979 | Mansfield | 324/309 |
| 4,318,043 | 3/1982 | Crooks et al. | 324/309 |
| 4,532,474 | 7/1985 | Edelstein | 324/309 |

FOREIGN PATENT DOCUMENTS

| | | |
|---|---|---|
| 0103397 | 3/1984 | European Pat. Off. |
| 0121312 | 10/1984 | European Pat. Off. |
| 0137420 | 10/1984 | European Pat. Off. |
| 2833800 | 6/1979 | Fed. Rep. of Germany |
| WO81/02788 | 10/1981 | PCT Int'l Appl. |
| WO81/02789 | 10/1981 | PCT Int'l Appl. |

OTHER PUBLICATIONS

NMR Imaging in Biomedicine (1982), pp. 65-77, Mansfield et al.
Phys. Med. Biol., 25, 751-756 (1980), Spin Warp Imaging and Applications to Human Whole Body Imaging, Edelstein et al.
Phys. Review 112, No. 5 (1958), 1693-1701, Steady State Free Precession in Nuclear Magnetic Resonance, Carr.
Rev. Sci. Instrum., 37, No. 1 (1966), 93-102, Application of Fourier Transform Spectroscopy of Magnetic Resonance, Ernst et al.
J. Molecul. Spectroscopy, 35, 298-305 (1970), Sensitivity in Fourier Transform NMR Spectroscopy of Slowly Relaxing Systems, Waugh.
J. App. Phys., 47, 3709-3721 (1976), Image Formation by Nuclear Magnetic Resonance: The Sensitive Point Method, Hinshaw.
J. Magn. Resonance, 29, 355-373 (1978), Biological and Medical Imaging by NMR, Mansfield et al.
J. Phys. E: Sci. Instrum., 13, 1980, 947-955, A Whole Body NMR Imaging Machine, Hutchinson et al.
J. Magn. Resonance, 63, 14-30 (1985), The Limitations of NMR Recalled-Echo-Imaging Techniques, Johnson et al.
I.E.E.E. Spectrum, Band 20, No. 2, Feb. 1983; Seiten 32-38, N.Y.; P. A. Bottomley "Nuclear Magneti Resonance: Beyond Physical Imaging".
Proceedings of the IEEE, Band 70, No. 10, Oct. 1982; Seiten, 1152-1173; N.Y.; Z. H. Cho et al: "Fourier Tansform Nuclear Magnetic Resonance Tomographic Imaging.
Spektrum Der Wissenschaft, Jul. 1982, Seiten 40-55; I. L. Pykett, "Kernspitomograhie: Rontgenbilder ohne Rontgenstrahlen".

Primary Examiner—Michael J. Tokar
Assistant Examiner—Kevin D. O'Shea
Attorney, Agent, or Firm—Frishauf, Holtz, Goodman & Woodward

[57] ABSTRACT

A fast low angle shot ("FLASH")-NMR method is described, which uses radio frequency excitation pulses having a flip angle substantially less than 90 degrees, and subsequent reading gradient reversal for producing a gradient echo signal. The small flip angle pulses create an equilibrium state between longitudinal and transverse magnetization, which allows to apply the radio frequency pulses repeatedly with high repetition rate to produce gradient echo signals of essentially equal strength, without any intervening delay for magnetization restoration or recovery.

14 Claims, 35 Drawing Figures

METHOD OF RAPID ACQUISITION OF SPIN RESONANCE DATA FOR A SPATIALLY RESOLVED INVESTIGATION OF AN OBJECT

The present invention relates to methods employing magnetic spin resonance techniques for investigating a sample or an object. More specifically, but not exclusively, the invention relates to nuclear magnetic resonance (NMR) methods for rapid acquisition of NMR data for image reconstruction as for imaging nuclear spin tomography. The invention is also useful for acquisition of electron spin resonance data.

BACKGROUND OF THE INVENTION

The principles of image producing NMR methods, as NMR tomography, are described in an article by I. L. Pykett "NMR Imaging In Medicine" "SCIENTIFIC AMERICAN, May 1982, pp. 54–64. A more detailed explanation of NMR techniques is comprised in a monography by P. Mansfield and P. G. Morris with the title "NMR Imaging in Biomedicine", Academic Press, New York, N.Y., 1982.

In short, an image producing NMR method comprises essentially the steps, to position an object (more precisely a region to be investigated of the object) into a homogeneous, static "longitudinal" magnetic field ("$B_o$ field"), which aligns unpaired nuclear spins within the object into a Z direction parallel to the $B_o$ field, so that a magnetization in Z direction results. This constant, homogeneous $B_o$ field is present in all NMR methods during the entire experiment and this is generally tacitly assumed in the following explanation. Then, the object is irradiated with a radio frequency excitation pulse (RF pulse) by which, from the viewpoint of classical mechanics, the spins are tipped or rotated by a predetermined angle (flip angle) away from the Z direction, the flip angle depending on the amplitude and duration of the RF pulse. The spins will then precess about the Z direction with the so-called Larmor frequency and the transverse component of their magnetization in the plane (XY plane) normal to the Z direction can be detected as output signal. A flip angle of 90 degrees rotates the entire Z magnetization into the XY plane and the output signal has then its maximum amplitude. A flip angle of 180 degrees reverses the direction of the magnetization or spins.

Three relaxation times play an essential role in NMR methods, i.e. the spin-lattice relaxation time $T_1$, the spin-spin relaxation time $T_2$ and the effective spin-spin relaxation time $T_2^*$. Three magnetic field gradients, which are essentially normal to each other and one being generally aligned with the $B_o$ field, are used for coding spatial information into the output signal and for producing specific output signals, such as so-called gradient echo signals. The amplitude and duration of the gradient fields are controlled in accordance with the specific method employed. Further details can be derived from the above-mentioned publications and the patent literature, thus, they are mentioned in the following only as far as they are essential for the present invention.

It has been an aim since the discovery of the NMR tomography to reduce the time ("acquisition time"), which is required for obtaining the NMR data necessary for image reconstruction. Further important features of an image producing NMR method are the spatial resolution (i.e. the dimensions of a resolved image element or pixel of the image which can be reconstructed from the obtained data), and the signal-to-noise ratio (SNR).

A quite rapid NMR tomography method is the Echo Planar Imaging method described by P. Mansfield (J. Magn. Reson. 29, 355–373, 1978), in which a complete free induction decay (FID) signal is detected in the presence of both an alternating magnetic field gradient (in the following in short "gradient") and a constant gradient of predetermined magnitude after a single RF pulse. This method is also described in U.S. Pat. Nos. 4,115,730, and 4,165,479. However, the spatial resolution obtainable with the Echo Planar Imaging method is limited by physical constraints and cannot be improved beyond a certain limited by increasing the measuring time. Also the SNR is not as high as desirable.

Further fast methods for acquiring NMR data for image reconstruction, which use spin echos, are described in U.S. patent application Ser. No. 806,780 filed Dec. 9, 1985, incorporated by reference.

SUMMARY OF THE INVENTION

In accordance with the invention, a method for rapid acquisition of NMR data for two- and three-dimensional image reconstruction is provided, which combines the advantage of a reduced acquisition time, which is acceptable for many applications, with a high spatial resolution and a high SNR in a manner not obtainable by the prior art methods.

In accordance with the invention, a series of similar excitation pulses with a flip angle, the absolut value of which is substantially smaller than 90 degrees, are used to tilt into the XY plane a small proportion of the magnetization or spins which are aligned into the Z direction by the constant $B_0$ field, and the tilted spins are used as completely as possible by gradient switching to produce one or a plurality of gradient echo signals. Since the major portion of the spins remains oriented in the Z direction and, thus, a copious supply of Z magnetization is still available, immediately after detecting the echo(s) a new "partial excitation" RF pulse can be applied which again flips only a small proportion of the spins oriented in the Z direction into the XY plane, so that the next gradient echo signal or signals can be produced by gradient switching without delay which undesirably slows down the data acquisition, such a delay by an intervening relaxation period in the order of $T_1$ and/or a restoring RF pulse must be allowed in the prior art methods before the next signal generating RF pulse can be applied to the object.

A preferred embodiment of the present invention for rapid acquisition of nuclear spin resonance data for a spatially resolved investigation of a region of an object which comprises nuclear spins having a predetermined spin-lattice relaxation time $T_1$, a predetermined spin-spin relaxation time $T_2$, and a predetermined effective spin-spin relaxation time $T_2^*$ comprises the steps:

The object region is positioned in a homogeneous magnetic field, which aligns the spins in a predetermined direction and, thus, produces a predetermined longitudinal magnetization.

The object is repeatedly irradiated with a radio frequency pulse, which tilts the spins out of said predetermined direction so that said longitudinal magnetization is reduced and a predetermined transverse magnetization is produced.

At least one alternating read magnet field gradient and at least one further magnetic field gradient are applied to said region in timed relationship with each radio frequency pulse to produce at least one gradient echo signal and code spatial information into said signal, said gradients being essentially normal to each other. Information is derived from said gradient echo signal(s).

According to the invention, the radio frequency pulses have a flip angle, the absolute value of which is by such an amount less than 90 degrees, and have a mutual distance in time which is so small, that an equilibrium state is established between the remaining longitudinal magnetization and the transverse magnetization produced by said radio frequency pulses, in which equilibrium state the longitudinal magnetization is preponderant and essentially the same amount of longitudinal magnetization or longitudinally aligned spins sufficient for producing a detectable gradient echo signal is available for each radio frequency excitation pulse. Each gradient echo signal is sampled at a plurality of locations to derive the desired NMR data for further processing as known in the art.

Which flip angle is best suited for a given application depends to some degree on the strength of the $B_o$ field, the spin-lattice relaxation times $T_1$ of the spins in the sample, and the desired $T_1$ contrast. Flip angles with an absolute value below 75 degrees are generally regarded assuitable. The region from 10 to 50 degrees is preferred at present. E.g. in the case of a $B_o$ field in the order of 2 to 3 Teslas (T) flip angles between about 15 degrees and 30 degrees are preferred.

The present method may be termed "gradient inversion method with small flip angles and small radio frequency power" or "fast low angle shot" (FLASH) method, and is useful with any strength of the $B_o$ field.

A preferred embodiment of the method according to the present invention for rapid acquisition of NMR data for a spatially resolved investigation of at least a region of an object, which comprises nuclear spins, comprises the steps:
(a) The object region is positioned into a homogeneous $B_o$ magnet field which aligns the spins into a predetermined longitudinal direction (Z direction);
(b) A radio frequency or high frequency pulse is applied to said object region to tilt the spins by a predetermined flip angle out of said longitudinal direction;
(c) At least one coding magnetic field gradient (slice or phase gradient) is applied to said region;
(d) After termination of said radio frequency pulse, at least once
  (aa) at least one reading gradient having a predetermined polarity is applied for a predetermined period of time to said object region,
  (bb) the polarity of each reading gradient is reversed to produce a gradient echo signal,
  (cc) each reading gradient is maintained for a predetermined reading period after the reversal of polarity;
  (dd) said gradient echo signal produced by the polarity reversal of said reading gradient is detected,
(e) each reading gradient is switched off, and
(f) the method steps (b) to (e) are repeated after a predetermined period of time has lapsed after reading gradient switching off.

Up to three magnet field gradients are available, and these gradients are essentially normal to each other.

According to the present invention
(g) the flip angle of the radio frequency pulses has an absolute value of no more than 75 degrees, preferably no more than 50 degrees or 30 degrees or 25 degrees, and preferably more than 10 degrees.

(h) All of said coding gradients (slice and phase gradients) are switched off before the data acquisition from the gradient echo signal begins (before method step dd), and
(i) the predetermined period of time between the reading gradient switching off (method step e) and the application of the next radio frequency pulse (method step b) is essentially smaller than the spin-lattice relaxation time.

The data acquisition is effected by sampling each gradient echo signal to produce a plurality of samples which are short relative to the reading period.

The predetermined period of time in accordance with method step (i) is preferably no more than 20 milliseconds (ms), preferably no more than 10 ms.

NMR methods are known which use flip angles smaller than 90 degrees. It is also known, to produce a gradient echo by reversing the polarity of a magnet field gradient ("reading gradient"):

Flip angles smaller than 90 degrees are used e.g. in the so-called SFP (steady state free precession) method described by W. S. Hinshaw in J. Appl. Phys. 47, No. 8, August 1967, which is based on a publication by H. Y. Carr, Phys. Rev. 112, 1693–1701, 1958. The SFP method comprises irradiating the sample with a series of radio frequency pulses, the repetition time or spacings of which are small relative to the spin-lattice relaxation time and small relative to the spin-spin relaxation time. An equilibrium signal develops between the radio frequency pulses which contains information about only one single pixel of the sample. Thus, this method is extremely time consuming, since already images with moderate resolution require acquisition times in the order of hours.

Flip angles smaller than 90 degrees may also be used in the Echo Planar Imaging method (l. c.). However, in this method, an alternating gradient ($G_y$) and a constant gradient ($G_z$) are maintained from the end of the radio frequency pulse until the end of the data acquisition period. The image reconstruction used in this method differs basically from all other NMR methods in that a discrete projection profile of the object is produced by Fourier transformation of the periodically decaying and rising FID signal. The constant gradient ($G_z$) works as read gradient, it must be small relative to the strength of the alternating gradient, to avoid destroying the discrete projection profile. This also limits the spatial resolution which can be obtained with this method. In contrast thereto, all gradients used in the method according to the invention can have the same magnitude or order of magnitude, and the signal is a gradient echo signal produced by reading gradient polarity switching.

Producing NMR data for the reconstruction of slice images by means of gradient echo signals is known from the publication by Edelstein et al, Phys. Med. Biol., 25, 751–756 (1980) and the PCT publication Nos. W081-02788 and W081-02789. In this so-called "Spin Warp" method, which is also known as SR or RFID method, a slice of the sample is excited by a 90 degree radio frequency pulse and a simultaneously applied slice gradient. Thereafter, one or a plurality of echo signals are produced by switching on a read gradient and reversing its polarity once or a plurality of times; said echo signals being gradient echos according to the present terminology. A system relaxation period must be allowed between the echo signal detection and the application of the next radio frequency pulse, said period being long in comparison with $T_1$ and is in the order of one second or more. This makes this method unsuitable in cases where a rapid data acquisition is needed.

A total experiment of the method according to the invention produces in a relatively short period of time a complete set of NMR data sufficient for reconstructing at least one NMR tomogram. A total experiment comprises a series of partial experiments, which each comprise a radio frequency pulse with a flip angle having an absolute value of essentially less than 90 degrees, as less than 75 degrees or 50 degrees or 25 degrees or in some cases even smaller than 15 degrees or 5 degrees, further a phase coding gradient pulse and/or at least one alternating read gradient, and at least one gradient echo signal produced by an alternating read gradient. All gradient fields are switched off or, in the case of read gradients, reversed in polarity between the end of the exciting radio frequency pulse and the beginning of the data acquisition. The partial experiments can follow each other immediately after the acquisition of NMR data from the gradient echo signal has been completed. The only delay imposed is that which is necessary for gradient switching and this delay is generally less than 10 to 20 milliseconds. Thus, the usual relaxation or recovery delays in the order of the spin-lattice relaxation time (generally about 0.5 to 2.0 seconds) are completely avoided.

Particular advantages in the data acquisition method according to the invention are:

(1) Extremely low radio frequency loading of the object under investigation, due to the fact that for each partial experiment only one radio frequency pulse with a flip angle substantially smaller than 90 degrees is necessary.

(2) A particularly good signal-to noise ratio, since a saturation of the magnetization, contributing to the echo signal can be avoided by means of using "fraction-of-90-degree" pulses, and a continual high share of steady-state magnetization through $T_1$ relaxation of magnetization constituents already used in the experiment can be maintained.

(3) The suitability for unlimited continuous image data production due to the obtained dynamic steady state, as already mentioned under (2).

(4) The possibility resulting from (3) to chose any desired compromise between temporal and spatial resolution of the NMR tomograms.

(5) The resulting tomograms contain $T_1$ information, because of the fact, that with a predetermined flip angle, each $T_1$ value corresponds to a steady state with another amplitude. Thus, by variation of the flip angle from total experiment to total experiment a varied $T_1$ weighting can be achieved.

(6) If only one gradient echo signal is produced and sampled for data acquisition, the obtained projections have an equal signal strength so that the resolution in the reconstructed image, specifically in the direction of the phase coding gradient, has the same high value across the whole image.

(7) By producing a slice image several times (which does not need to be synchronized), and by superimposing the subsequently produced slice images, motion artifacts can be avoided to a large extent. Thus, clear, un-blurred slice images of the human abdomen or end-diastolic slice images of the human heart can be produced. The same applies to 3D images, since motion artifacts are suppressed by averaging also in this case.

(8) Free choise of the time/space resolution, e.g.

64×128 pixels in about 1 second
128×128 pixels in about 2 seconds
128×256 pixels in about 3 seconds
256×128 pixels in about 4 seconds, and
256×256 pixels in about 6 seconds.

These measuring times can be shortened by about 20 to 40%, if optimized gradient systems are used.

(9) Generation of NMR tomograms with variable contrasts within seconds with like measuring time by
variation of the flip angle of the radio frequency pulses for $T_1$ contrast enhancement;
variation of the sampling time of the gradient echo for $T_2^*$ contrast enhancement;
production of a plurality of gradient echos for each excitation pulse with the same phase coding for $T_2^*$ contrast enhancement;
use of suitable substances, as NMR contrast materials, water, electrolytes, for variation of $T_1$ and/or $T_2^*$;
use of additional radio frequency pulses (e.g. 90°, 180°, CHESS and so on) which are applied at one or few places of a total experiment between the partial experiments.

(10) The possibility of time-sequential image-producing investigations ("motion pictures") of living structures, specifically human beings, with NMR tomograms in the order of seconds, more specifically data acquisition for
image sequences of immediately succeeding NMR tomograms of different, e.g. directly adjacent slices (e.g. according to the method of FIG. 6),
image sequences of NMR tomograms of a slice which follow each other immediately in time (e.g. according to the method of FIG. 5),
image sequences of the above described type with simultaneous application of suitable substances, as NMR contrast materials, water, electrolytes for variation of $T_1$ and/or $T_2^*$.

(11) The possibility of obtaining NMR data for image-producing investigations of periodical events in living systems, specifically human beings, with NMR tomograms (see the following description of FIGS. 5 and 6) with
using trigger techniques for starting a series of partial experiments with the same phase coding, repeating such a series with varied phase coding upon occurence of the next trigger pulse,
use of gating techniques, wherein the partial experiments are continuously repeated until a new trigger pulse initiates a new series of partial experiments with different phase coding, which is varied from trigger pulse to trigger pulse.

Each total experiment of the above type produces data for an image sequence, in which the distance in time of the images corresponds to the duration of a partial experiment.

(12) The possibility of combining rapid image-producing investigations of living systems, specifically human beings, with spectroscopic, more specifically spatially localized spectroscopic NMR methods in a time-sharing experiment.

(13) The possiblity of acquisition of data for three dimensional (3D) images of living systems (see the following description of FIGS. 7 and 8), in which the main advantage over the prior art 3D NMR methods is the much shorter data acquisition time, e.g. 4 minutes for a 128×128×128 pixel image. The high SNR per unit of time of the sequences allows to produce extremely thin slices (1 mm and less). The contrast of the image can be varied in accordance with (9). More specifically, data can be acquired for isotropic 3D representations, from which images with any desired orientation can be reconstructed (see FIG. 7), chemical-selective images of the above described type (see FIG. 8), multiple echo 3D images of the above described type by using a plurality of gradient echos (analogeous to FIG. 4), section or zoom 3D images by using a slice-selective pulse in one or two directions of the phase coding gradient(s) for limiting the imaged volume, microscopic 3D images of tiny samples with very thin slices.

(14) The possibility of image producing investigations of living systems in combination with surface coils, as by using a homogeneous transmitting coil and a surface coil for receiving in all of the embodiments of the present method described below, and using a surface coil for transmitting and receiving in all of the embodiments described below.

(15) The possibility of data acquisition for an image producing investigation of flow phenomena and vessels with NMR tomograms in the order of seconds, more specifically imaging of blood vessels, which extend normal to the plane of the slice, e.g. with a method according to (9) with variation of the flip angle or the sampling time of the gradient echos and/or the strength of the reading gradient, multiple slice takings of the above type with a time separation of 1 to 3 $T_1$ for three-dimensional reconstruction of blood vessels.

Many further applications, which are not mentioned here for lack of space, will occur to those skilled in the art and the physician.

The so-called "Echo-Planar-Imaging" method does not have the advantages mentioned under (2), (3), and (4) of the method according to the invention. However, it can be integrated as a partial experiment into a procedure according to the invention, assuming that rapid switching of the magnetic field gradients (rapid compared with $T_2^*$) is possible. The procedure according to the above identified earlier patent application does not possess the advantages mentioned under (2) of the present invention.

SHORT DESCRIPTION OF THE DRAWINGS

FIGS. 13A to 13M show a series of images which have been reconstructed with NMR.

DETAILED DESCRIPTION OF PREFERRED EMBODIMENTS

The diagrams show radio frequency pulses (RF), gradient fields, i.e. slice gradients "G-slice", phase-coding gradients "G-phase" and reading gradients "G-read", further measuring signals, i.e. gradient echo signals, of partial and total experiment sequences, whereby the number of repetitions of each partial experiments and/or the number of repetitions of each total experiment is indicated in the corresponding short-dashed boxes. The illustration of the phase-coding gradient is intended to show, as usual in the art, that the amplitude of the phase gradient pulse changes from partial experiment to partial experiment. The number of partial experiments thus corresponds to the number of different amplitudes of the phase-coding gradient. Radio frequency pulses with rectangularly drawn envelope curves represent non-selective radio frequency pulses. Radio frequency pulses with Gaussian-form drawn envelope curves represent frequency-selective curves with a selectible envelope shape, that is chemical shift selective (CHESS), or, if a gradient is present, slice-selective radio frequency pulses.

The various embodiments of the method according to the invention can be carried out with known spin-resonance systems, in particular NMR-apparati, only the control unit, which controls the switching of the gradient magnetic fields and the exciting radio frequency pulses, is modified in such a manner that it is able to perform functions according to a form of embodiment or, selectively, one of several embodiments of the present method.

Figure 16:
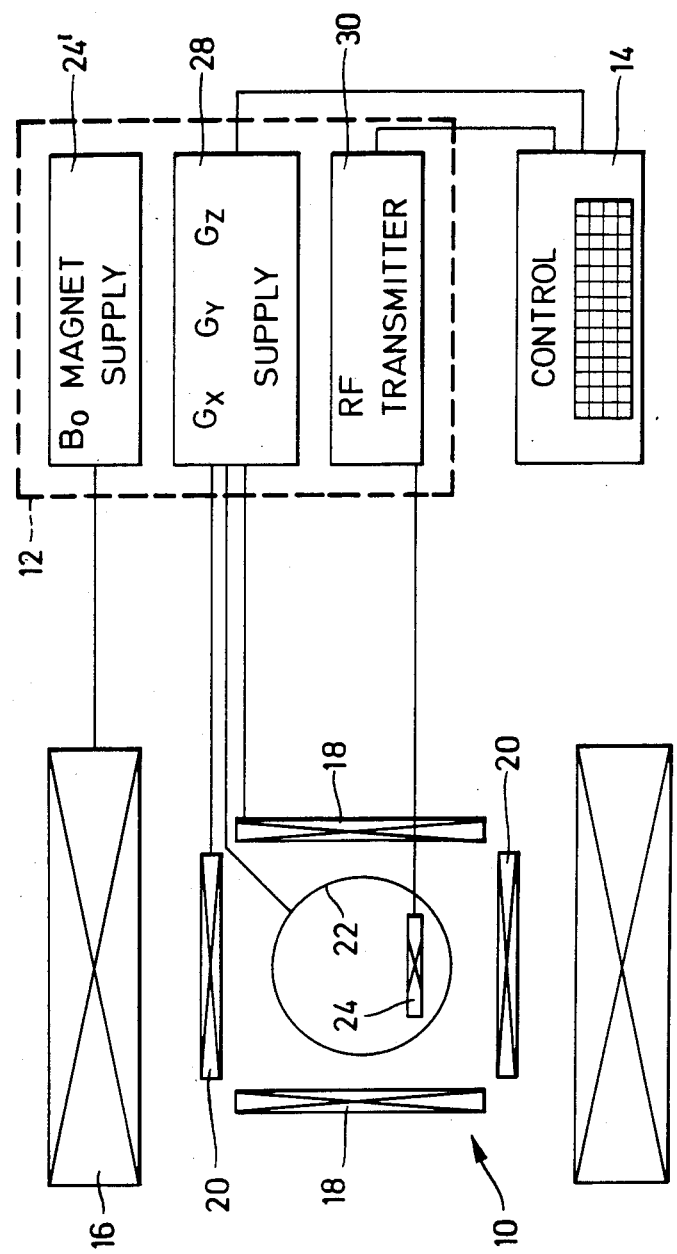
FIG. 16 is a block diagram of a NMR system, which can be used for carrying out the method according to the invention.

As shown in FIG. 16, a measuring head of the NMR system may, as usual, contain a preferably superconducting magnet 16, energized by magnet supply unit 24', for the generation of a constant, homogeneous, "longitudinal" $B_o$ field and coil assemblies 18, 20, 22, energized by unit 28 for the generation of three generally linear magnetic field gradients which are essentially normal to each other. Unit 24 is a r.f. magnet system to which radio frequency pulses are fed from an r.f. transmitter unit 30. Units 24', 28, 30 form a supply system 12, controlled by a control unit 14. Included in the term radio frequency pulse should be understood not only an oscillation of predetermined frequency with any desired envelope curve which, if it is short and has a high amplitude, is considered a non-selective pulse, but also a frequency-modulated radio frequency oscillation, furthermore a sequence of relatively short radio frequency oscillations with distances from each other, which feature the same or differing frequencies and result entirely in a predetermined flip angle. A frequency-selective pulse is a slice-selective pulse or a resonance line-selective (CHESS = "chemical shift" selective) pulse.

In the method according to the invention principally radio frequency pulses are used the flip angle of which is only a fraction of the most frequently used excitation pulse flip angle of 90°. The partial experiments succeed each other immediately without the otherwise usual waiting times of the magnitude $T_1$ of the spin-lattice relaxation time. The length of the partial experiments is maximally only approximately $3T_2^*$; the length of the total experiment is correspondingly maximally only $3nT_2^*$, if n is the number of the partial experiments.

Figure 1:
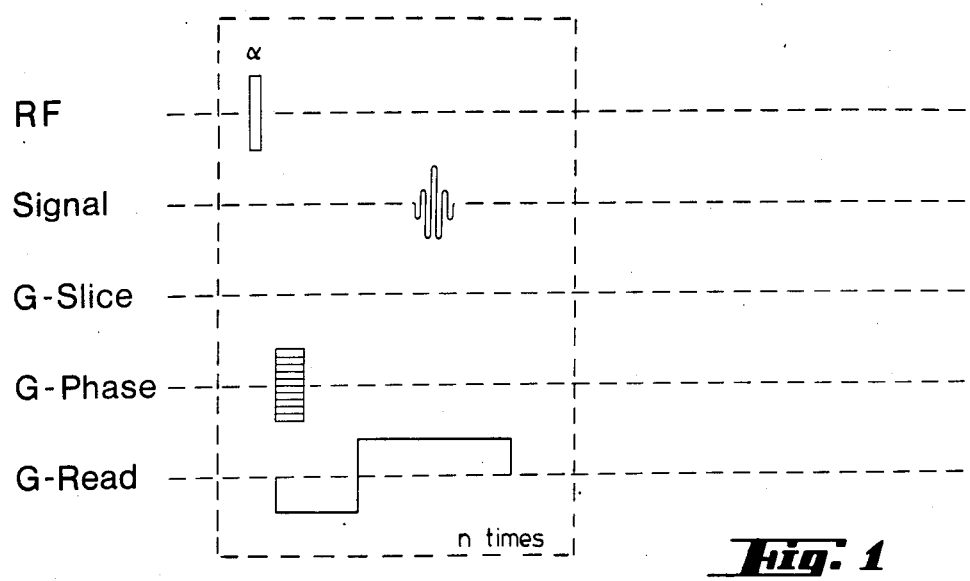
FIGS. 1 and 2 are partial-experiment diagrams for embodiments of the method according to the invention, which produce NMR data for reconstructing transillumination or projection images without slice selection.

FIG. 1 shows the amplitude/time relationship of a radio frequency pulse RF, a measuring or output signal and gradient fields, i.e. a phase gradient G-Phase and a reading gradient G-Read, of a partial-experiment of an exemplary embodiment of the present methods which provides NMR data useful for reconstructing a transillumination or projection image without slice selection. The depicted partial experiment is repeated with the least possible delay (mainly due to gradient switching processes) n-times with n different amplitudes of the phase-coding gradient. Thus, the next radio frequency pulse is applied immediately after the reading gradient G-Read has been switched off. The flip angle alpha of the non-selective pulse (RF) is a fraction of 90 degrees, and is for example in the range from 10 to 50 degrees. The reading gradient is alternated for the generation of a gradient echo signal.

Thus, the gradient pulse G-Phase is switched on after termination of the radio frequency pulse RF and switched off before the data acquisition begins, i.e. before the sampling of the gradient echo signal is initiated. The reading gradient G-Read is switched on after the termination of the radio frequency pulse RF, reversed in polarity to produce the gradient echo signal, and maintained for the time of data acquisition or sampling. The time-amplitude integral of the portion of the reading gradient before polarity reversal is identical to the time-amplitude integral of the portion of the reading gradient after polarity reversal and before the maximum gradient echo signal.

The gradient echo signal is sampled for data acquisition to produce a plurality, e.g. 128 or 256, of short samples which follow each other with a distance in time of e.g. 20 microseconds corresponding to a sampling rate of 50 kHz. The resulting signal samples are demodulated and used for image reconstruction by a computer as well known in the art.

When the data acquisition is completed and the read gradient pulse G-Read of the partial experiment shown in the dashed rectangle has been switched off, the next radio frequency pulse RF is applied with the least possible delay, which the switching off of the reading gradient allows (and which an be much shorter than $T_1$ or $T_2^*$), which starts the next partial experiment. This applies also for the following embodiments and examples. A relaxation time is not necessary, since sufficient spins oriented in the Z or $B_o$ direction are still present for the excitation by the next radio frequency pulse, because of the relatively small flip angle used, which has consumed only a small portion of the $B_0$ magnetization.

It can be of advantage, to commence the data acquisition only after some "dummy" partial experiments (preferred embodiments, which do not need any dummy experiments will described later). For example about 5 to 50 dummy partial experiments may be performed before the data acquisition begins or before the data acquired are further processed, said dummy partial experiments serving the purpose to establish the equilibrium state of the Z magnetization which corresponds to the flip angle used, so that all later produced gradient echo signals, which are sampled, have essentially the same information content. Dummy partial experiments may be dispensed with when the total experiments is comprised of partial experiments, in which the flip angles of the exciting radio frequency pulses increase from a small value in such a manner that about the same amount of magnetization is read out by each radio frequency pulse.

Figure 2:
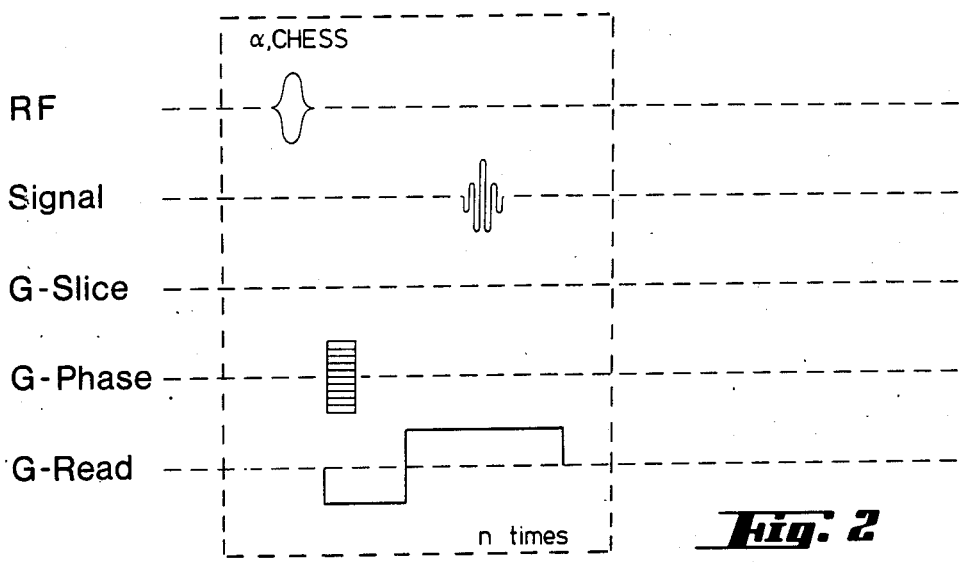

FIG. 2 shows a partial experiment of an embodiment of the method according to the invention which provides NMR data useful for reconstructing a resonance-line selective (CHESS) transillumination or projection image without slice selection.

Figure 3:
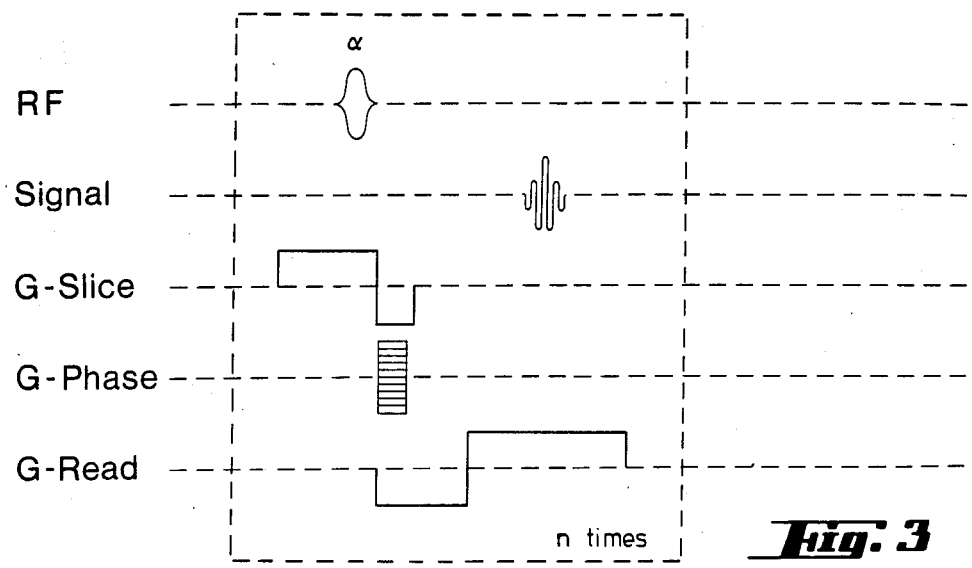
FIGS. 3 to 6 are corresponding diagrams for embodiments of the method according to the invention, which produce NMR data for reconstructing slice tomograms.

FIG. 3 shows a partial experiment of an embodiment of the method according to the invention which provides NMR data useful for reconstructing a slice tomogram. In this embodiment, a frequency-selective radio frequency pulse RF is combined with a slice gradient G-Slice.

In the slice-selective modification of the present method, the slice gradient G-Slice is switched on before or together with the radio frequency pulse, reversed in polarity for refocussing purposes after the termination of the radio frequency pulse, and switched off before the data acquisition begins. Otherwise, the remarks made in connection with FIG. 1 apply.

Figure 4:
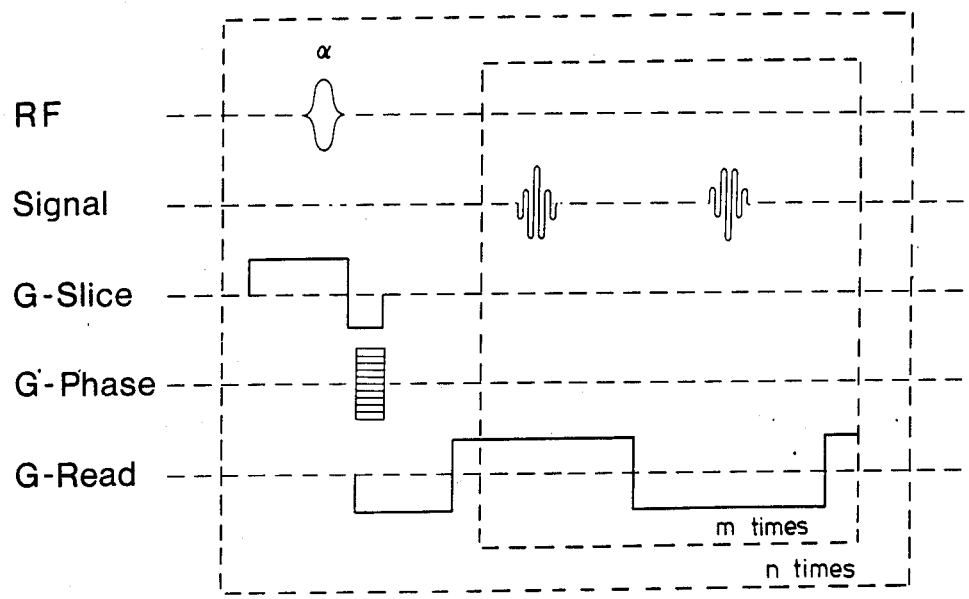

FIG. 4 shows a partial experiment of an embodiment of the method according to the invention, which provides NMR data useful for reconstructing a slice-tomogram, the $T_2^*$ contrast of which is improved by the utilization of m echo signals, thus the reading gradient G-Read is alternated n-times. The corresponding data which are derived from the m gradient echos stemming from the same radio frequency pulse may be superimposed or averaged to increase the SNR.

Figure 5:
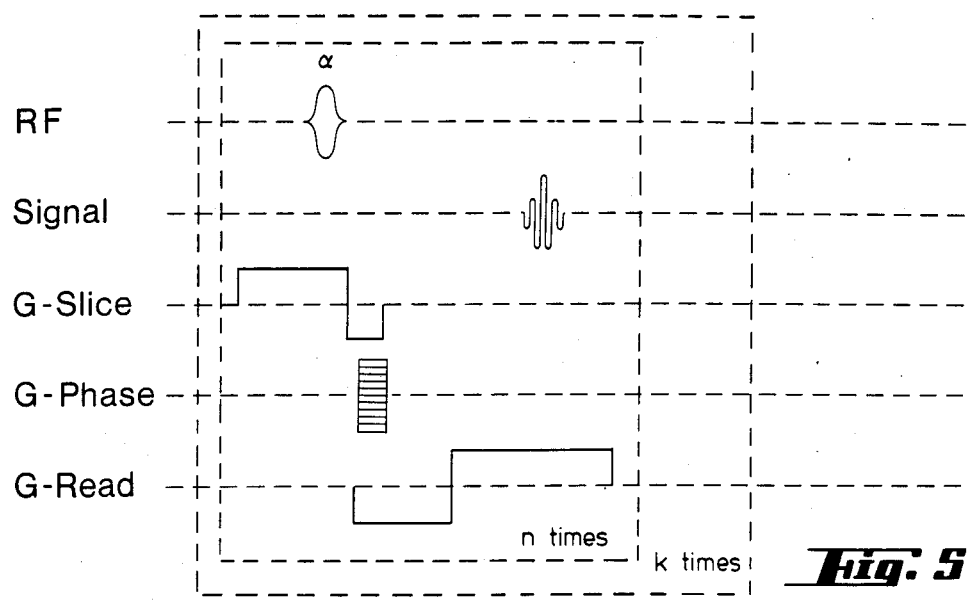

FIG. 5 shows a diagram of an embodiment of the present method which provides NMR data useful for reconstructing a number k of slice tomograms of the same slice immediately after each other. The total experiment consisting of n partial experiments is repeated k-times without any recovery or relaxation intervals between succeeding partial and total experiments. This method is without any alternative in the image producing NMR art, since it enables a continuous image production without temporal limitation and without loss in the signal strength. Therefore it is particularly advantageous for the investigation of dynamic processes. The duration of each partial experiment may be as short as 15 milliseconds.

Figure 6:
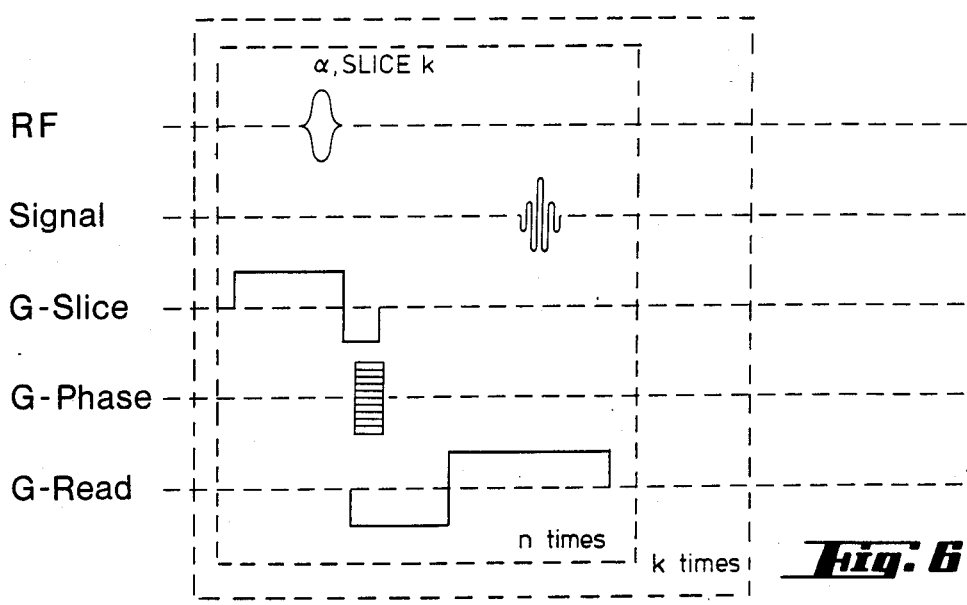

FIG. 6 shows a diagram of an embodiment of the present method which provides NMR data useful for reconstructing a number k of slice-tomograms from various slices immediately after each other. The carrier frequency of the radio frequency pulse of all partial experiments forming a total experiment is changed from total experiment to total experiment. This experiment can be combined with the method described with reference to FIG. 5.

Figure 7:
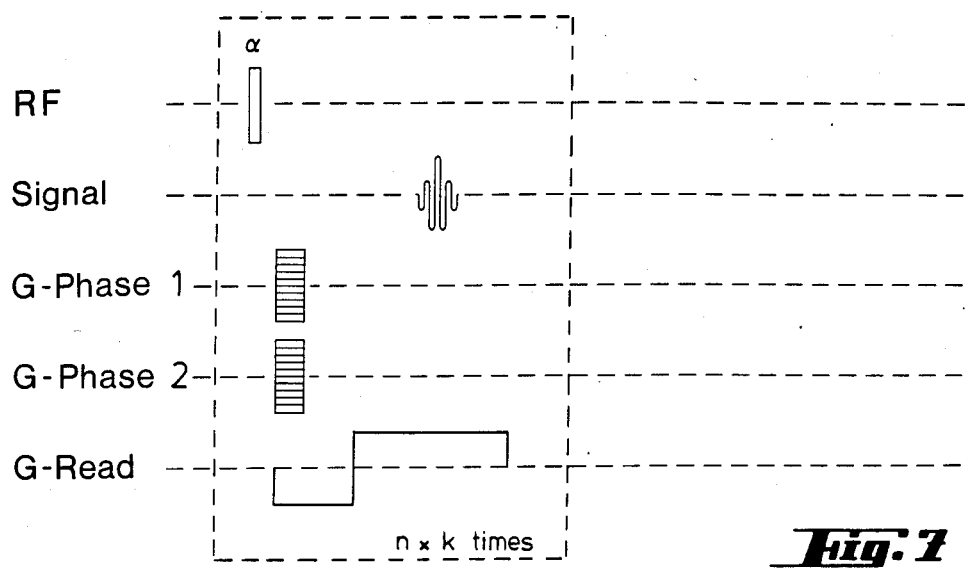
FIGS. 7 and 8 are corresponding diagrams of embodiments of the invention for producing NMR data for three-dimensional (3D) tomograms.

FIG. 7 shows a diagram of a partial experiment of an embodiment of the present method which provides NMR data useful for reconstructing a three-dimensional tomogram. Each partial experiment comprises a non-selective radio frequency pulse and first and second phase-coding gradients G-phase 1 and G-phase 2, respectively are used with a plurality of n or k different amplitudes. Both phase gradients G-phase 1 and G-phase 2 are switched on after the termination of the radio frequency pulse and switched off before the beginning of the data acquisition, i.e. before or together with the polarity reversal of the read gradient G-Read. In this case, the total experiment comprises $n \times k$ partial experiments. This method is partially advantageous, since it allows to acquire the data for a three-dimensional anisotropic (k≠n) or isotropic (k=n) spatial representation of the object region to be investigated in approximately the measuring time which is required with conventional NMR tomography procedures for a two-dimensional section or slice image. The procedure can be used for reconstructing images of extremely thin slices.

Figure 8:
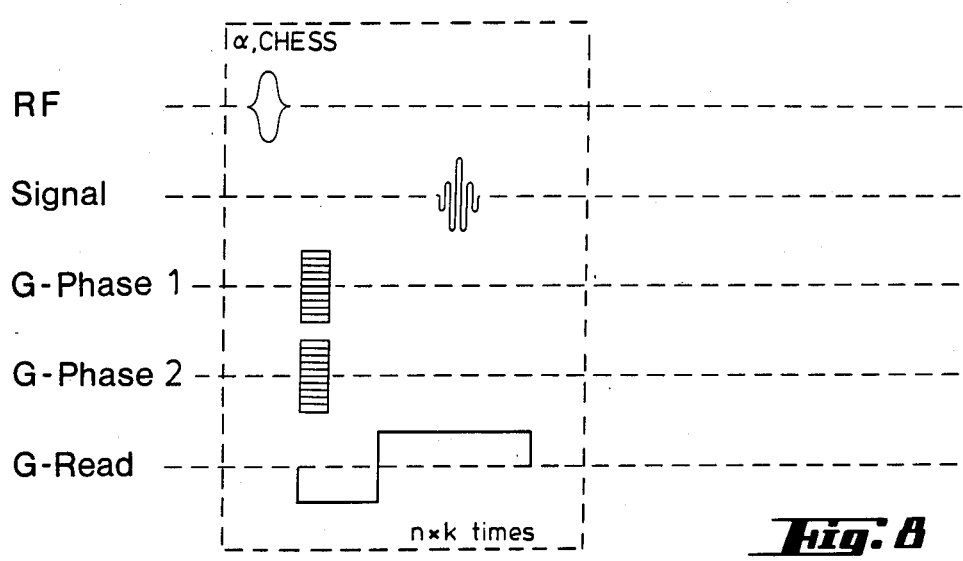

FIG. 8 shows a diagram of an embodiment of the present invention for deriving NMR data for the reconstruction of a three-dimensional, frequency-selective (CHESS) tomogram analogeous to FIG. 7. A frequency-selective radio frequency pulse is used in the method of FIG. 8 instead of the non-selective radio frequency pulse of the method of FIG. 7.

Figure 9:
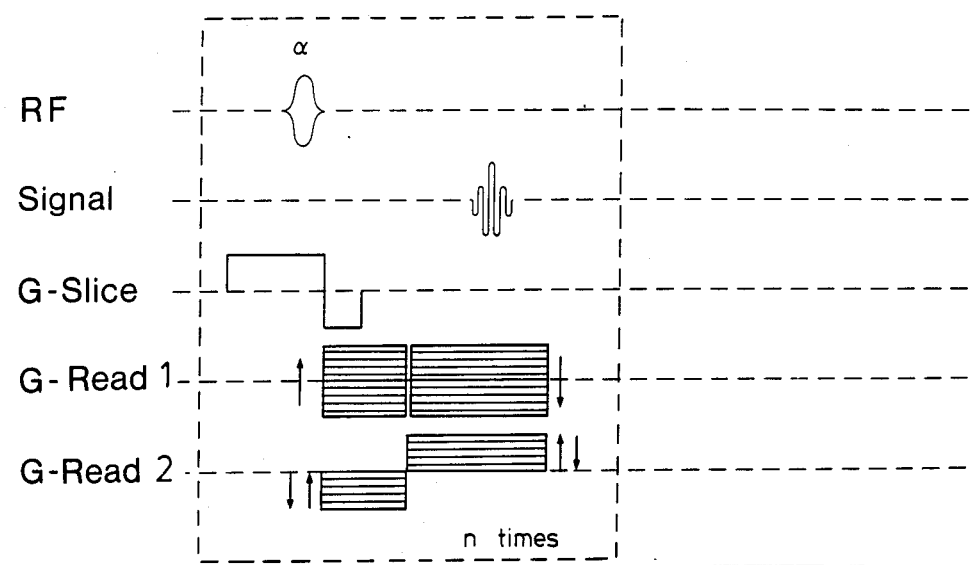
FIG. 9 is a corresponding diagram for an embodiment of the invention, which produces NMR data for tomograms according to the projection-reconstruction-method.

FIG. 9 shows a diagram of the partial experiments of an embodiment of the present method for producing NMR data useful for reconstructing a slice tomogram in accordance with the projection reconstruction method. A slice-coding gradient G-Slice is used in combination with a pair of reading gradients G-Read 1 and G-Read 2. The reading gradients are switched synchronously. The amplitudes of the reading gradients are changed from partial experiment to partial experiment in the directions indicated by the arrows. The pair of reading gradients has the combined effect of a resulting reading gradient, the orientation of which is rotated in the plane of the selected slice from partial experiment to partial experiment. The embodiments of FIGS. 1 to 8 may also be modified to produce data for the projection reconstruction method (with sole frequency coding) instead of the Fourier method (where a phase coding gradient is used).

It follows a description of specific, preferred embodiments of the method according to the invention. For performing these methods, a commercially available NMR tomography-spectroscopy system of the West German firm Bruker, Karlsruhe can be used which comprises a $B_o$ magnet with a field strength of 2.35 Tesla (T), corresponding to a proton resonance frequency of 100 MHz and with a bore having a diameter of 40 cm.

EXAMPLE 1

Figure 10:
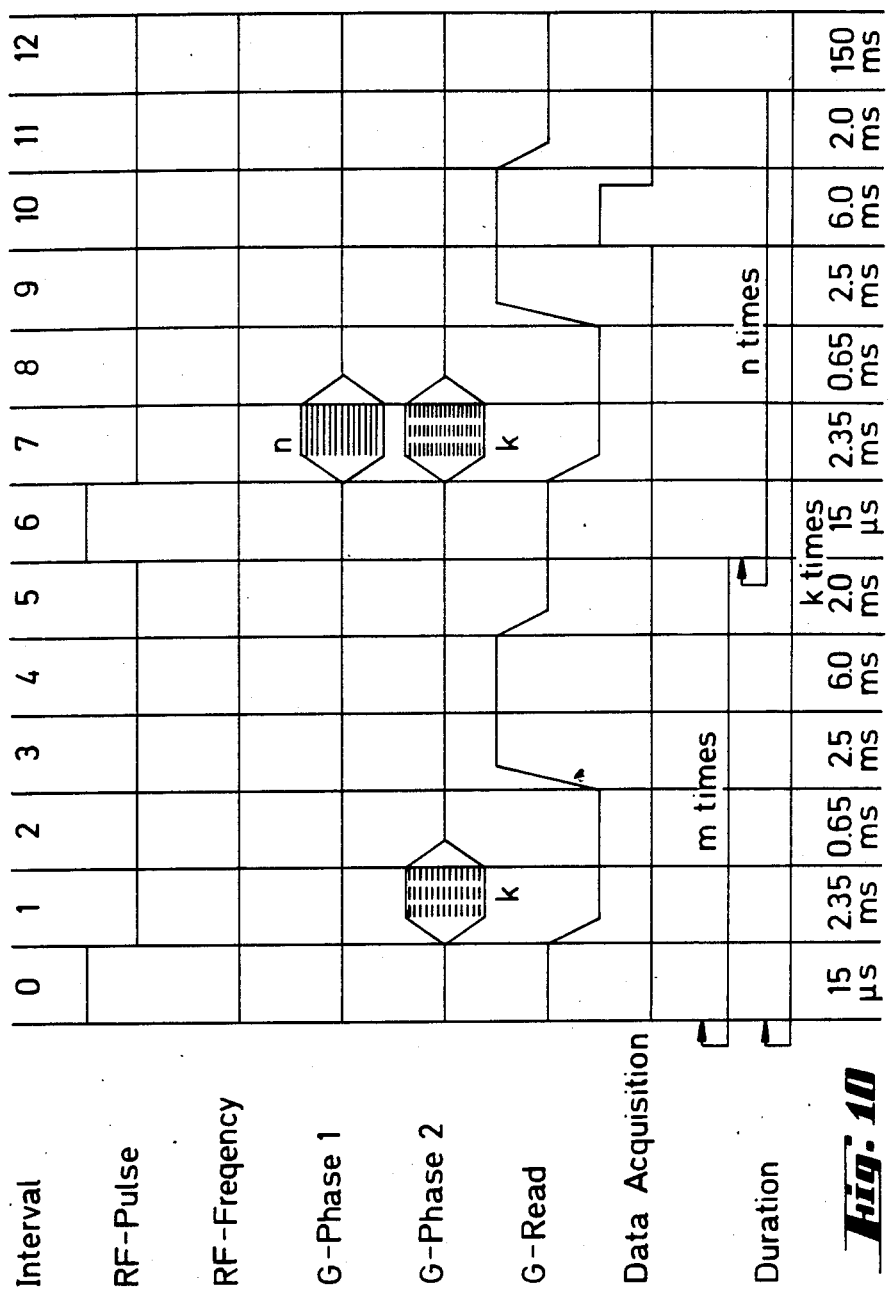
FIGS. 10 to 12 are more detailed diagrams of specific preferred embodiments of the invention.

Rapid three-dimensional image data acquisition Pulse sequence of FIG. 10 (analogous to FIG. 7)

| Interval | Operations |
| --- | --- |
| 0 | Application of a non-selective radio frequency (r.f.) pulse with rectangular envelope. The output power of the r.f. 38 transmitter is selected so that the r.f. pulse produces a flip angle of about 30 degrees. The length of the non-selective pulse is 15 microseconds, it is applied to a resonator with a diameter of 20 cm with a transmitting power of about 5 kW. The phase of the pulse is maintained constant. The frequency of the r.f. pulse is the resonant frequency of the water protons (100 MHz at 2.35 Tesla). |
| 1 | The reading gradient is switched on in preparation of the application of the reading gradient pulse during the intervals 3 and 4, the amplitude is −5.5 milliteslas per meter (mT/m). The phase gradient G-Phase 2 is switched on. |
| 2 | The reading gradient G-Read remains on; The phase gradient G-Phase 2 is switched off. |
| 3 | Polarity reversal of the reading gradient G-Read to the amplitude +4.5 mT/m. |
| 4 | The reading gradient remains on. |
| 5 | The reading gradient is switched off. After the end of this first "preparatory" interval, during which no data are acquired (or any acquired data are not used), the program switches back again to interval 0. |

The preparatory sequence 0 to 5 is repeated m-times (m=8). It establishes an essentially constant equilibrium state of the spin system. The preparatory sequences have also the purpose, to provide "preparatory" switching operations of the gradient coil system, which must be performed with the above mentioned NMR apparatus for technical reasons.

| Interval | Operations |
| --- | --- |
| 6 | The r.f. pulse RF is switched on. This pulse has the same properties in respect to frequency, amplitude, duration and shape as the radio frequency pulses used in interval 0. |
| 7 | The phase gradient G-phase 1 is switched on. The read gradient is switched on in preparation to the read gradient switching in intervals 9 and 10, the amplitude is −5.5 mT/m; The second phase gradient G-Phase 2 is switched on. |
| 8 | The phase gradients 1 and 2 are switched off. The reading gradient remains on. |
| 9 | The polarity of the reading gradient is reversed and the amplitude of the reading gradient is switched to +4.5 mT/m. |
| 10 | The reading gradient remains on. Acquisition of each 128 "real" and "imaginary" data by sampling the gradient echo signal produced by the polarity reversal of the reading gradient, and quadrature detection of the obtained samples with a spectral width of about 25 kHz (sampling period 20 microseconds corresponding to a sampling rate of 50 kHz). |
| 11 | End of data acquisition; the reading gradient is switched off. |
| 6a to 11a | The sequence 6 to 11 is repeated (n-1)-times. |

Thus, the sequence 6 to 11 is performed in total n-times (here n=128) with n different amplitudes of the phase gradient 1 from −5.0 to +5.0 mT/m. The phase gradient 2 has the same amplitude during all of these 128 sequences 6 to 11.

| Interval | Operations |
| --- | --- |
| 12 | Storing the n sets of sampled data samples. The NMR system mentioned above requires this step, which needs 150 milliseconds, because the available storage capacity of the core memory of the computer is limited to 128K. The interruption by step 12 makes it necessary, to establish again the spin equilibrium state by means of the operations in intervals 0 to 5. Thus, the sequence jumps back to interval 0. |

In an improved system with larger storage capacity, the sampled data are directly processed further. In this case, interval 12 is omitted and the sequence can jump back to interval 6.

| Interval | Operations |
| --- | --- |
| 12a | The total sequence 0 to 12 is repeated (k-m)-times, thus, the sequence 0 to 12 is performed in total k-times (here k = 128) with k different amplitudes of the phase gradient 2 from −5.0 to +5.0 mT/m. |

In an optimized system, the total process needs n×k×(duration of intervals 6–11)=221 seconds. With the available NMR system, the total experiment needs $((m+m) \times (\text{interval } 6-11) + \text{interval } 12) \times k = 254$ seconds.

The thickness of an individual two-dimensional image is 1 mm, the resolution (pixel size) is 1 mm×1 mm.

EXAMPLE 2

Aquisition of data for a "motion picture" consisting of a series of rapid tomograms representing periodic motions from a number m of slices.

Figure 11:
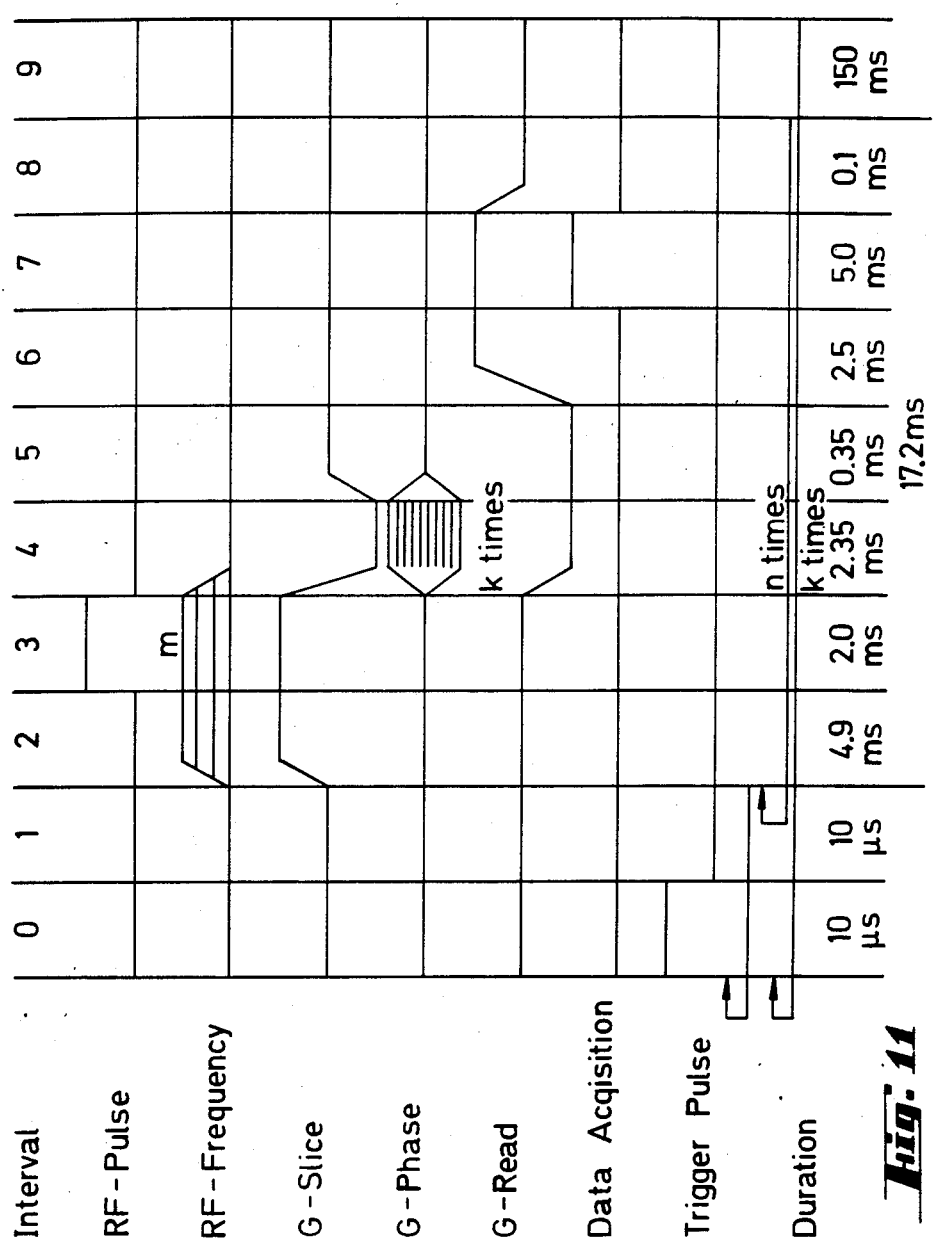

Pulse sequence according to FIG. 11 (analog to FIG. 6).

| Interval | Operation |
|---|---|
| 0/1 | Waiting loop for trigger pulse. After receipt of a trigger pulse, the sequence starts with interval 2. |
| 2 | The slice gradient is switched on, amplitude +5.0 mT/m. The radio frequency is set on the resonance frequency of the desired nuclei, e. g. of the water protons, in the desired slice. |
| 3 | A frequency-selective radio frequency pulse with a Gaussian envelope is irradiated into the object region under investigation. The radio frequency pulse has a flip angle of about 30 degrees. The full width at half maximum (FWHM) of the frequency spectrum of the pulse is about 900 Hz. The phase of the pulse is constant during the total experiment. |
| 4 | The polarity of the slice gradient is reversed by switching it to the amplitude −5.0 mT/m. The reading gradient is switched on in preparation to the application of the reading gradient in intervals 6 and 7; the amplitude is −5.5 mT/m. The phase gradient is switched on. |

This operation is repeated with the same amplitude while the sequence 2 to 9 is run through n-times (here n=32). The sequence 0 to 9 is repeated k-times (here k=128) with k different phase gradient amplitudes from −5.0 mT/m to +5.0 mT/m.

| | |
|---|---|
| 5 | The slice gradient is switched off. The phase gradient is switched off. The reading gradient is maintained on. |
| 6 | The reading gradient is reversed in polarity by switching the amplitude to +4.5 mT/m. |
| 7 | The reading gradient is maintained on. Each 128 real and imaginary data points are obtained by sampling the echo signal and quadrature detection of the obtained samples with a spectral width of 25 kHz. The sampling period is 20 microseconds. |
| 8 | Termination of the data acquisition; the reading gradient is switched off. |

The sequence jumps n-times back to interval 2. A number m of different radio frequencies corresponding to m different slices may be used in the subsequent repetitions of the sequence of steps 2 to 9. In the n repetitions of the sequence 2 to 9 (here n=32), the phase gradient is switched on in interval 4 with the same amplitude. During the k runs of the sequence 0 to 9 (here k=128), the phase gradient has k different amplitudes between −5.0 mT/m to +5.0 mT/m.

| | |
|---|---|
| 9 | Storing the n sets of data. This step is necessary with the above mentioned NMR systems because of the limited capacity of the core memory of the computer. Step 9 needs 150 milliseconds; thereafter the sequence jumps back to interval 0 into the waiting loop for the next trigger pulse. This process is performed m-times. |

The above described sequence permits the acquisition of a number n (here n=32) of rapid tomograms (resolution 128×128 pixels corresponding to k=128) which are taken immediately after a trigger pulse. The data for the first image are generated 7 milliseconds after the trigger pulse, each further image follows the preceding with a distance in time of 17.2 milliseconds.

In the case of a gating experiment, the total experiment is performed without the waiting loop 0/1. The trigger pluse in interval 0 serves in this case for switching the phase gradient to the next of its k different amplitudes.

The sequence is especially, but of course not exclusively suited for taking ECG triggered or gated images of the human heart. In this case, with n=50, the total heart cycle can be scanned in about 850 milliseconds and 50 images of a slice or 50/m images of m slices can be reconstructed with the aid of a computer from e.g. 128 or 256 of such scanning operations.

EXAMPLE 3

Acquisition of data for a motion picture consisting of a series of respective tomograms for investigating motions, functions and images from a number l of slices in real time.

Figure 12:
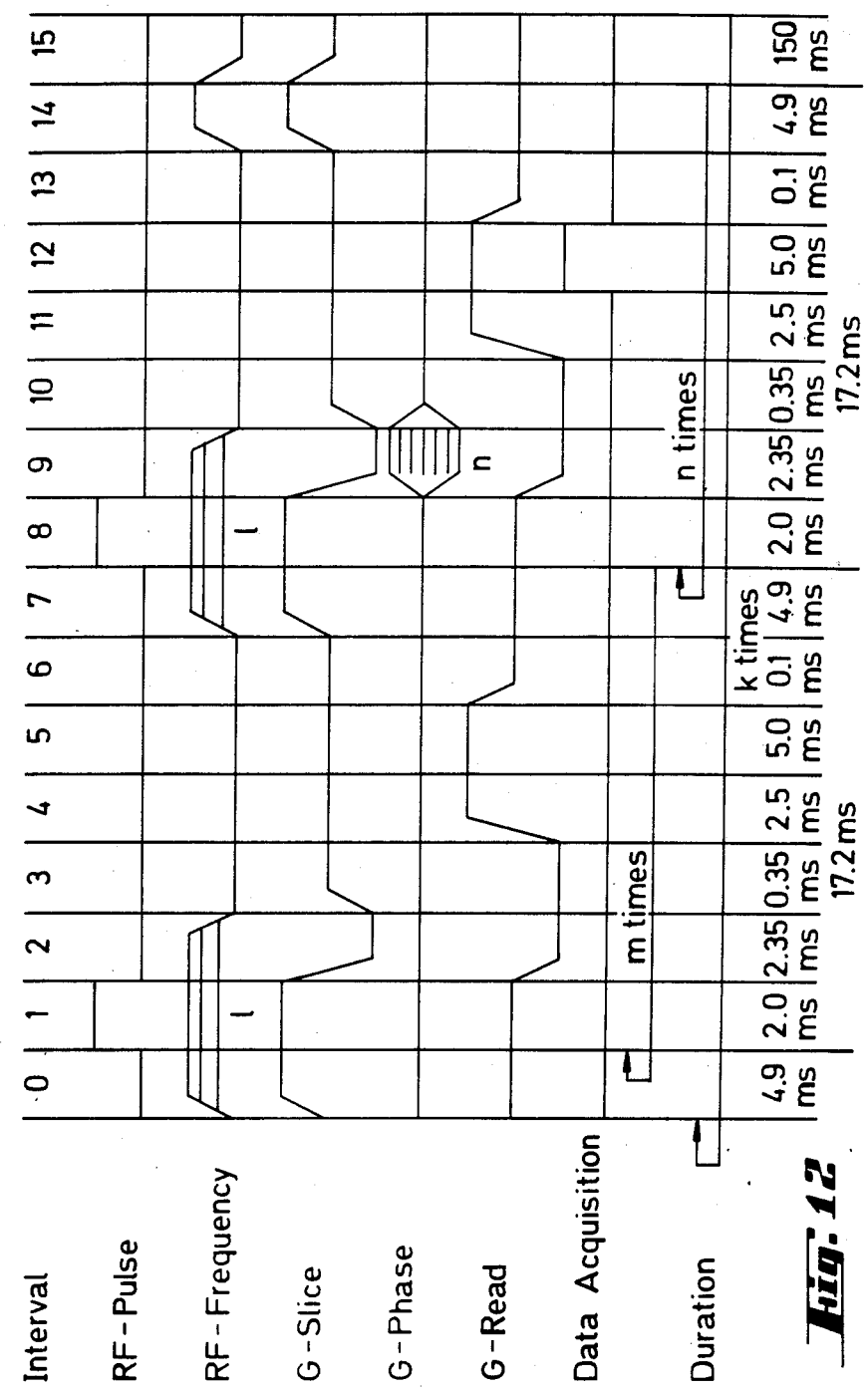
Figure 13A:
Figure 13B:
Figure 13C:
Figure 13D:
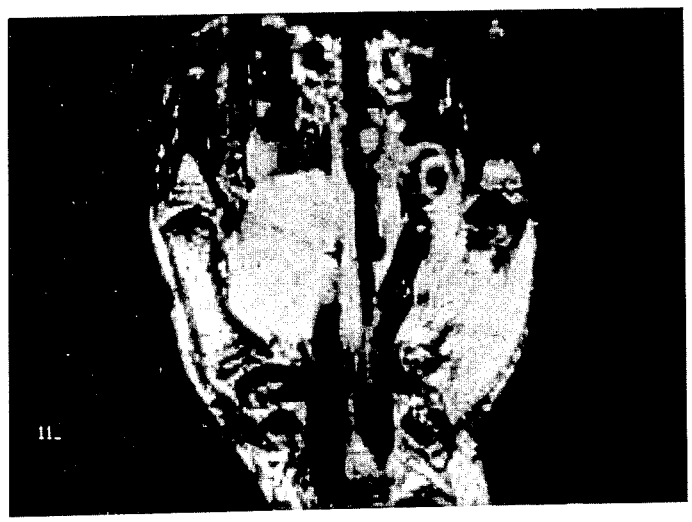
Figure 13E:
Figure 13F:
Figure 13G:
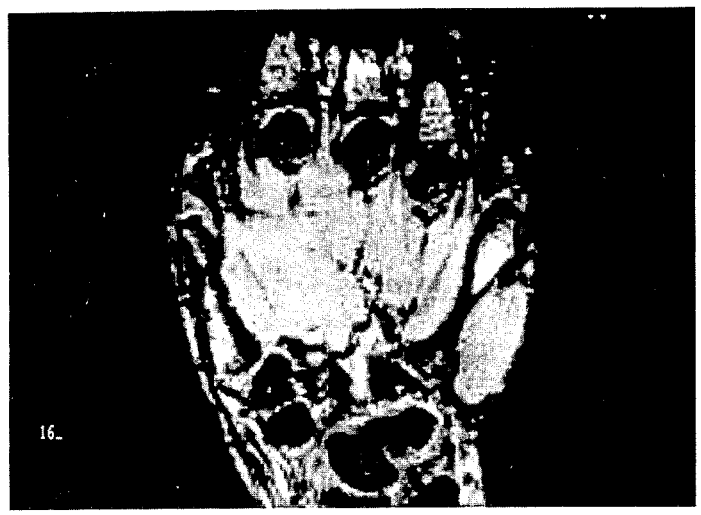
Figure 13H:
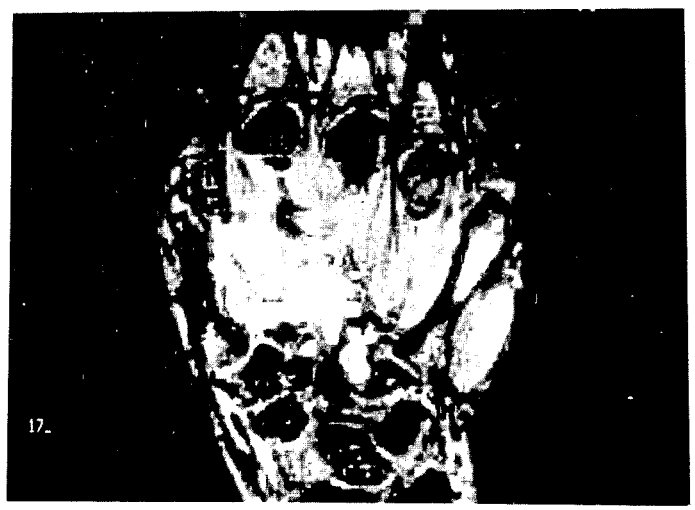
Figure 13I:
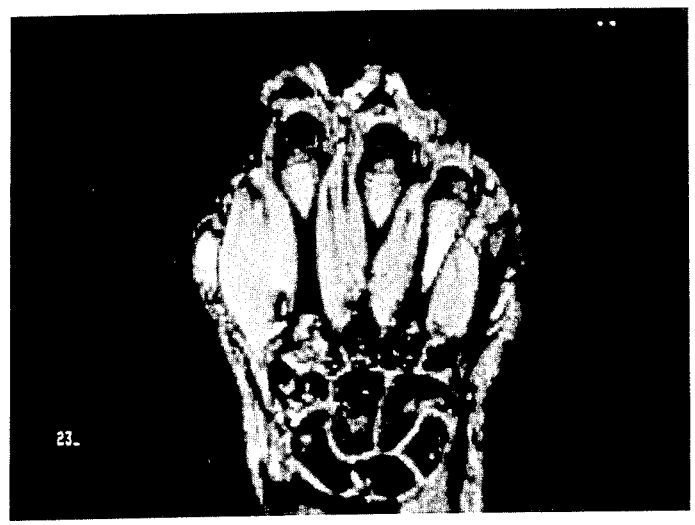
Figure 13K:
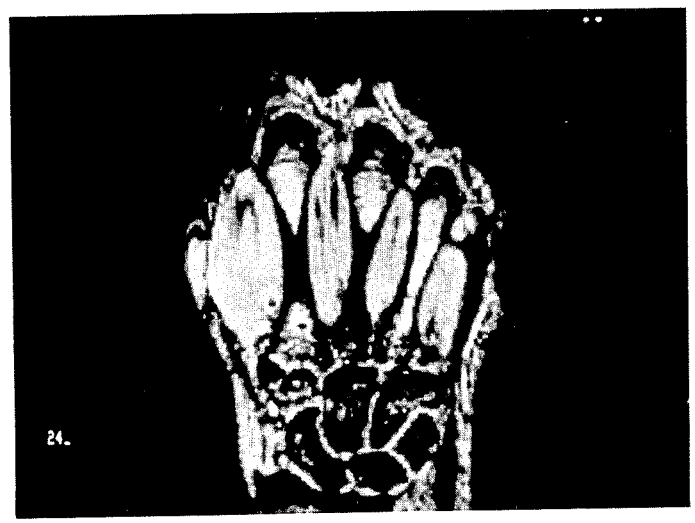
Figure 13L:
Figure 13M:

Pulse sequence of FIG. 12.

| Interval | Operations |
|---|---|
| 0 | The slice gradient is switched on, amplitude +5.0 mT/m. The radio frequency is set on the desired slice to be investigated. The frequency may be varied at will in the course of the k runs of the sequence to obtain data from l different slices. (l = 1 for motion pictures from a single slice; l = k for multiple-slice-motion pictures). |
| 1 | The slice gradient remains on. A frequency-selective radio frequency pulse with a Gaussian envelope is switched on. The pulse has a flip angle of about 30 degrees. The FWHM of the frequency spectrum of the pulse is about 900 Hz. The phase of the pulse is maintained constant during the entire experiment. |
| 2 | The radio frequency pulse is switched off. The radio frequency of the receiver is set on the frequency of interest, e.g. the resonant frequency of the water protons. The slice gradient is reversed in polarity by switching it to the amplitude −5.0 mT/m. The reading gradient is switched on in preparation to the reading in intervals 4 and 5; the amplitude is −5.5 mT/m. |
| 3 | The slice gradient is switched off. The reading gradient is maintained on. |
| 4 | The polarity of the reading gradient is reversed by switching the amplitude to +4.5 mT/m. |
| 5 | The reading gradient remains on. |
| 6 | The reading gradient is switched off. |
| 7 | The slice gradient is switched on, amplitude 5.0 mT/m. The radio frequency is set on the desired slice to be investigated. This frequency can be varied at will during the k runs of the sequence to obtain data from l different slices (see interval 0). |

The sequence goes back to interval 1 so that the sequence 1 to 7 is run through m-times (m=32). This brings the spin system into a constant equilibrium state and the preliminary switching operations are performed, which are necessary with the gradient field coils of the used NMR system.

| | |
|---|---|
| 8 | The slice gradient remains on. A frequency-selective radio frequency pulse is switched on, it has an Gaussian envelope and a flip angle of 30 degrees. The FWHM of the frequency spectrum of the pulse is about 900 Hz. The phase of the pulse is maintained constant during the entire experiment. |
| 9 | The radio frequency pulse is switched off. The radio frequency is set to the frequency of interest, e.g. the resonant frequency of the water protons. |

-continued

| | |
|---|---|
| | The slice gradient is reversed in polarity by switching it to the amplitude −5.0 mT/m.<br>The reading gradient is switched on in preparation to the reading in the intervals 11 and 12; amplitude −5.0 mT/m.<br>The phase gradient is switched on. This step is performed with n different amplitudes (here l = 128) between −5.0 mT/m to +5.0 mT/m during the n = 128 runs through the sequence 7 to 13. |
| 10 | The slice and phase gradients are switched off.<br>The reading gradient remains on. |
| 11 | The reading gradient is reversed in polarity by switching it to the amplitude +4.5 mT/m. |
| 12 | The reading gradient remains on.<br>Each 128 real and imaginary data are obtained by sampling gradient echo (sampling period 20 microseconds) and quadrature detection of the samples with the spectral width of 25 kHz. |
| 13 | The reading gradient is switched off, the data acquisition is terminated. |
| 14 | The slice gradient is switched on, amplitude 5.0 mT/m.<br>The radio frequency is set on a value corresponding to the desired slice. The radio frequency is varied corresponding to interval 0 in the course of the k runs through the sequence. |

The sequence jumps back n-times to interval 8.

| | |
|---|---|
| 15 | Storing of the n sets of data. |

Method step 15, which takes about 150 milliseconds, is necessary with the NMR system used, since the storage capacity of the core memory of the computer is limited. The interruption by step 15 necessitates to establish again the equilibrium state by m-times running through steps 0 to 7. Thus, the sequence jumps back n-times to interval zero to obtain data for m images. In an optimized system with the computer of sufficient storage capacity, interval 15 is omitted and the sequence can go on with interval 8.

FIGS. 13A to 13M show selected images of a series of images of the human hand, which has been reconstructed from data obtained with the rapid three-dimensional data acquisition method according to EXAMPLE 1 and FIG. 10. The total measuring time was 4 minutes, the spatial resolution is 128×128×128 pixels corresponding to 1 mm×1 mm×1 mm. FIGS. 13A to 13M show horizontal slice images in the region of the tendons (pictures No. 8 to 11), the muscles and articulation gaps (pictures No. 14 to 17) and the middle-hand bones (pictures No. 23 to 26), respectively.

Figure 14A:
FIGS. 14A and 14B show a series of images.
Figure 14B:

FIGS. 14A and 14B show a series of NMR tomograms obtained by the method according to EXAMPLE 3 and FIG. 12. The pictures show the flow conditions in a horizontal slice in a water-filled pot after stirring. The distance in time between subsequent pictures is 1.3 seconds. The left column (a) shows the undisturbed flow conditions after the end of the stirring while the pictures in the right column (b) shows the flow conditions immediately after an obstacle has been inserted at the upper margin of the pictures. The measuring time per image was 1.15 seconds, the spatial resolution 64×128 pixels, the thickness of the slice was 4 mm.

Figure 15A:
FIGS. 15A and 15B show another series of images which have been computed with NMR data obtained by the method of FIG. 12.
Figure 15B:
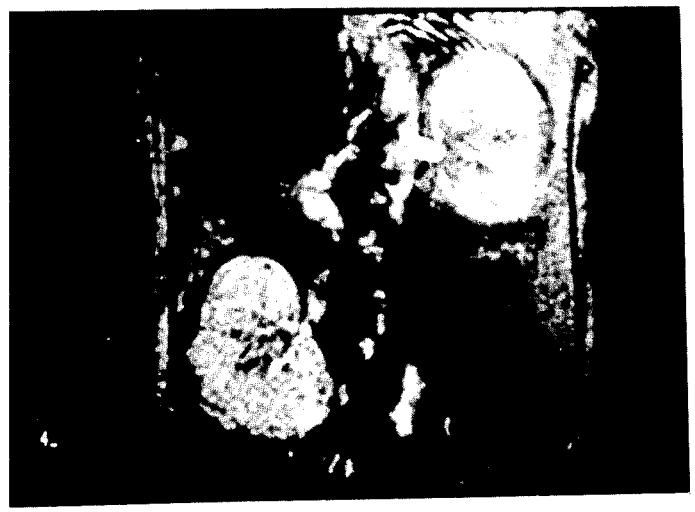
Figure 15C:
Figure 15D:
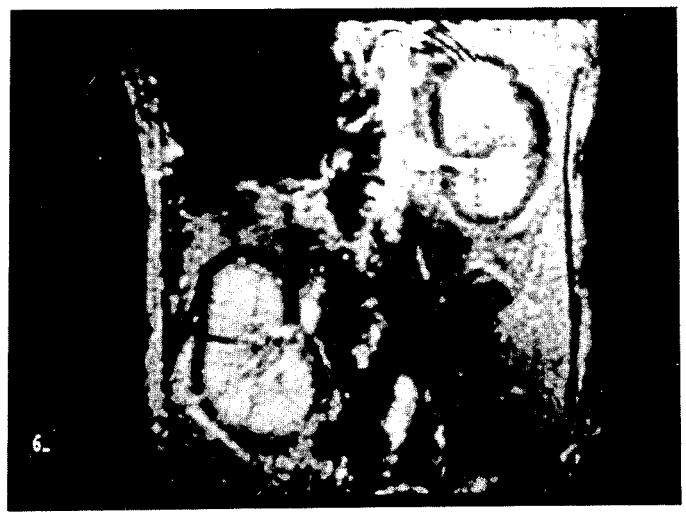
Figure 15E:
Figure 15F:
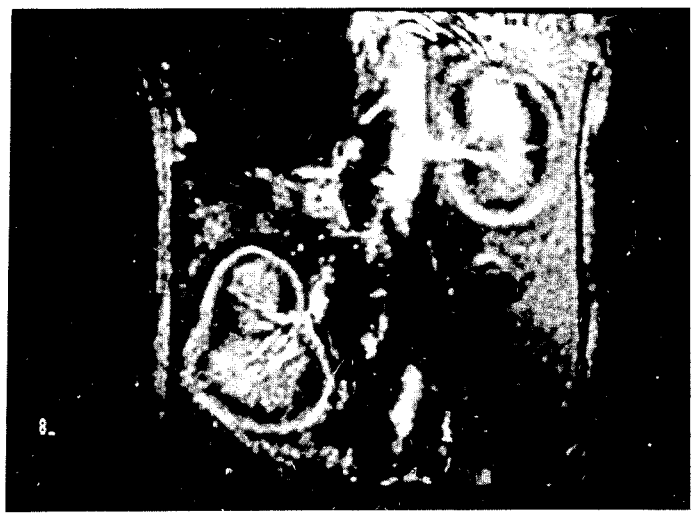
Figure 15G:
Figure 15H:
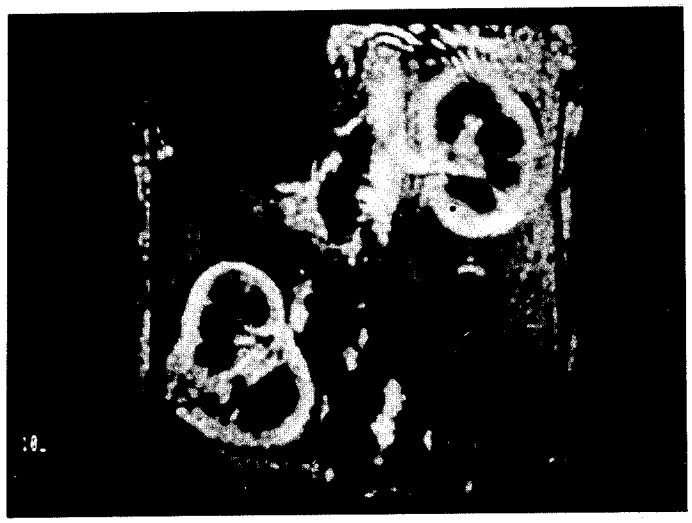

FIGS. 15A and 15B show pictures selected from a series of NMR tomograms having a distance in time of 6 seconds between pictures with subsequent numbers. The pictures show the kidney function of a rabbit after administration of 0.25 mmol/kg Gd (DTPA). The left kidney comprises a tumor. The measuring time of the "frames" was 2.2 seconds, the data of two subsequent takings were averaged to produce one picture. The resolution is 128×128 pixels and the thickness of the slice is 4 mm.

While this invention has been described with reference to particular embodiments and examples, other modifications and variations will occur to those skilled in the art in view of the above teachings. Thus, e.g. it has been mentioned already above, that the $T_1$ contrast can be varied by variation of the flip angle of the radio frequency pulses and the $T_2^*$ contrast can be modified by variation of the reading time.

A further possibility of contrast control consists in inserting at one or a few places (e.g. no more than about 10 percent of the number of the partial experiments of the total measuring cycle), e.g. between the preparatory sequence for equilibrium establishment, and the measuring sequence or after running through 16 or 32 partial experiments, a special additional radio frequency pulse or pulse burst, which may comprise e.g. a 90 degree pulse, a 180 degree pulse or a CHESS pulse. In a corresponding manner, additional frequency-selective radio frequency pulses having a flip angle of 90 degrees may be applied in the absence of any gradient field before and/or at a few places within a total experiment (few compared with a number of partial experiments), to obtain data for chemical-shift-weighted tomograms.

Undesired flow effects (as so-called reflow phenomena) can be suppressed by the application of such additional radio frequency pulses and/or additional radio frequency pulse bursts or trains, which, in combination with the slice selection gradient, affect the magnetization outside of the slice to be investigated of the tomogram. Thus, it can be avoided by this means, that blood, which flows into the measured slice, appears undesirably bright in the reconstructed image. A so-called DANTE pulse train may used for this purpose, i.e. a sequence of non-selective pulses having specific distances selected so that a desired frequency spectrum results, or a selective pulse having an appropriate envelope (shaped to obtain a desired harmonics content), may be used to saturate all spins outside of the interesting slice so that they will not contribute to the image even if they flow into the measured slice.

A preferred additional pulse train consists of a slice-selective 45 degree radio frequency pulse in ($-x'$) direction of the rotating coordinate system, then a non-selective 90 degree high frequency pulse in ($+x'$) direction and then another slice-selective 45 degree radio frequency pulse in ($-x'$) direction.

An experiment which uses radio frequency pulses, the flip angles of which increase from partial experiment to partial experiment to avoid dummy partial experiments for establishing the equilibrium state, and which is especially suited for deriving data for a series of multiple-slice tomograms, may be performed with the following flip angles, which have been calculated under the assumption of a ratio $T_1/TR=40$ (TR=repetition time of the partial experiments on which, and $T_1$, the values of the flip angles depend to some degree). Since the flip angles increase fairly slowly, only the flip angle for each tenth partial experiment are listed:

| Partial experiment No. | Flip angle (degrees) |
|---|---|
| 1 | 7.5 |
| 10 | 8.1 |
| 20 | 8.7 |
| 30 | 9.4 |

-continued

| Partial experiment No. | Flip angle (degrees) |
|---|---|
| 40 | 10.0 |
| 50 | 10.7 |
| 60 | 11.5 |
| 70 | 12.2 |
| 80 | 13.2 |
| 90 | 14.2 |
| 100 | 15.6 |
| 110 | 17.4 |
| 120 | 20.5 |
| 130 | 28.1. |

The specific values mentioned in the description of the examples, embodiments and modifications thereof are examples only and should not be interpreted in a limiting sense. They may, however, be used to give an idea of the order of magnitude involved.

What is claimed is:

1. A method for a rapid acquisition of spin resonance data for a spatially resolved investigation of an region of an object comprising atomic spins, such as nuclear spins, which exhibit a predetermined spin-lattice relaxation time $T_1$, a predetermined spin-spin relaxation time $T_2$ and a predetermined effective spin-spin relaxation time $T_2^*$, the method comprising the steps:
   (a) positioning said object region in a homogeneous magnetic field ($B_o$) to align the spins into a predetermined direction (Z direction),
   (b) irradiating said object region with a radio frequency (r.f.) pulse which tilts the spins by a predetermined angle (flip angle) out of said predetermined direction;
   (c) applying at least one coding magnetic field gradient (slice gradient, phase gradient) to said region;
   (d) effecting after the termination of the r.f. pulse at least once;
   (aa) applying to said region at least one reading gradient with a predetermined polarity for a predetermined period of time;
   (bb) reversing the polarity of each reading gradient to produce a gradient echo signal;
   (cc) maintain each polarity reversed reading gradient for a desired reading period;
   (dd) sampling said gradient echo signal;
   (e) switching off each reading gradient and
   (f) repeating the method steps (b) to (e) after a predetermined delay, wherein at most three magnetic field gradients are applied which are essentially normal to each other, the improvement consisting in
   (g) the flip angle of the r.f. pulse is less than 75 degrees;
   (k) all coding gradients (slice and/or phase gradients) are switched off before the beginning of the sampling of the gradient echo signal (method step (dd); and
   (i) the predetermined delay between the reading gradient switching off (method step e) and the application of the next following r.f. pulse is substantially smaller than the spin-lattice relaxation time.

2. The method as claimed in claim 1, characterized in that between method step (a) and the sequence of the method steps (b) to (f) a preparatory sequence comprising the method steps (b) to (cc), (e) and (f) is performed a sufficient number of times so that an equilibrium state between the spins aligned in said predetermined direction (Z) and the spins tilted out of this direction is obtained and the gradient echo signals produced by the following method steps (bb) all have essentially the same magnitude.

3. The method as claimed in claim 1, wherein r.f. pulses with successively increasing flip angles are used in the course of repeating the sequence (b) to (e) in according with method step (f).

4. The method as claimed in claim 1, wherein said flip angle has an absolute value of no more than 50 degrees.

5. The method as claimed in claim 1, wherein said flip angle has an absolute value no more than 30 degrees.

6. The method as claimed in claim 1, wherein said flip angle has a value of at least 10 degrees.

7. The method as claimed in claim 1, wherein said predetermined delay is less than 20 milliseconds.

8. The method as claimed in claim 1, wherein said predetermined delay is less than 10 milliseconds.

9. The method as claimed in claim 1, wherein a slice gradient is applied as coding gradient during the application of said r.f. pulse, said slice gradient being polarity reversed after the termination of the r.f. pulse and switched off before the sampling of the gradient echo begins, and that a phase gradient is applied as a second coding gradient, said phase gradient being switched on after the termination of said r.f. pulse and switched off before the gradient echo sampling begins (FIGS. 3 to 6).

10. The method as claimed in claim 1, wherein a pair of phase gradients are applied as coding gradients; that in the course of the repeated runs through method steps (b) to (e), a first of said pair of phase gradients is applied with step-wise varied amplitude, while the second of said phase gradients is maintained constant, and that the above sequence is again repeated a second number (k) of times with step-wise varied second phase gradient (FIGS. 7 and 8).

11. The method as claimed in claim 1, wherein a slice gradient is applied as coding gradient with a predetermined polarity during said r.f. pulse, said slice gradient being polarity reversed after the termination of said r.f. pulse and switched off before the sampling of the echo signal begins, and that first and second reading gradients are applied in method steps (aa) to (e), the amplitudes, which the gradients have during method steps (aa) and (cc) being varied in opposite directions between methods steps (e) and (f) (FIG. 9).

12. The method as claimed in claim 1, wherein the period between the switching on of said r.f. pulse and the first reading gradient polarity reversal is in the range between zero and three times of the effective spin-spin relaxation time.

13. The method as claimed in claim 1, wherein at least one additional r.f. pulse is applied to said region during certain delays of method steps (f), while all gradient fields are switched off, the number of said certain delays being no more than 10 percent of all delays according to method step (f) which occur during a predetermined experiment.

14. The method as claimed in claim 13, characterized in that at least one additional pulse is selected from the group of pulses comprising a 90 degree pulse, 180 degree pulse and a CHESS pulse.

* * * * *